United States Patent
Chen et al.

(10) Patent No.: US 12,288,292 B2
(45) Date of Patent: Apr. 29, 2025

(54) AUTOMATIC GENERATION METHOD FOR THREE-DIMENSIONAL MORPHOLOGY OF RUTS IN ASPHALT PAVEMENTS

(71) Applicant: Southeast University, Jiangsu (CN)

(72) Inventors: Leilei Chen, Jiangsu (CN); Daoxie Chen, Jiangsu (CN); Yuxuan Liu, Jiangsu (CN); Zhendong Qian, Jiangsu (CN); Wei Li, Jiangsu (CN)

(73) Assignee: Southeast University, Jiangsu (CN)

( * ) Notice: Subject to any disclaimer, the term of this patent is extended or adjusted under 35 U.S.C. 154(b) by 0 days.

(21) Appl. No.: 18/721,198

(22) PCT Filed: Nov. 24, 2022

(86) PCT No.: PCT/CN2022/134003
§ 371 (c)(1),
(2) Date: Jun. 18, 2024

(87) PCT Pub. No.: WO2024/103434
PCT Pub. Date: May 23, 2024

(65) Prior Publication Data
US 2025/0054234 A1  Feb. 13, 2025

(30) Foreign Application Priority Data
Nov. 18, 2022 (CN) .......................... 202211446498.5

(51) Int. Cl.
*G06T 17/00* (2006.01)
*G06F 30/13* (2020.01)

(52) U.S. Cl.
CPC .............. *G06T 17/00* (2013.01); *G06F 30/13* (2020.01)

(58) Field of Classification Search
None
See application file for complete search history.

(56) References Cited

FOREIGN PATENT DOCUMENTS

| CN | 107462204 | 12/2017 |
|---|---|---|
| CN | 108710730 | 10/2018 |
| CN | 112160222 | 1/2021 |
| JP | 2015031018 | 2/2015 |

OTHER PUBLICATIONS

Liu Yao et al., "Creating of 3D Road Model Based on Plan and Section", Journal of HUST (Urban Science Edition), May 2005, submit with English abstract, pp. 156-158.

"International Search Report (Form PCT/ISA/210) of PCT/CN2022/134003," mailed on Jun. 20, 2023, with English translation thereof, pp. 1-4.

*Primary Examiner* — Peter Hoang
(74) *Attorney, Agent, or Firm* — JCIPRNET

(57) ABSTRACT

An automatic generation method for three-dimensional morphology of ruts in asphalt pavements comprises: constructing a standard rut cross-section representation model, classifying ruts, acquiring detection data of a rutted section of an asphalt pavement, selecting different rut cross-sections at equal intervals in a longitudinal direction of the pavement, denoising and smoothening the rut cross-sections, selecting feature points according to geometric fluctuation features of the rut cross-sections, connecting the feature points and fitting a cross-sectional curve based on an evolution law of rut deformation, and fusing multiple reconstructed rut cross-sections to realize automatic generation and visualization of three-dimensional morphology of a rut.

9 Claims, 5 Drawing Sheets

AUTOMATIC GENERATION METHOD FOR THREE-DIMENSIONAL MORPHOLOGY OF RUTS IN ASPHALT PAVEMENTS

CROSS-REFERENCE TO RELATED APPLICATION

This application is a 371 of international application of PCT application serial no. PCT/CN2022/134003, filed on Nov. 24, 2022, which claims the priority benefit of China application no. 202211446498.5, filed on Nov. 18, 2022. The entirety of each of the above-mentioned patent applications is hereby incorporated by reference herein and made a part of this specification.

TECHNICAL FIELD

The invention relates to the field of road infrastructure digitization, in particular to an automatic generation method for three-dimensional morphology of ruts in asphalt pavements.

DESCRIPTION OF RELATED ART

Road infrastructure digitization refers to converting complex and variable information, such as the spatial attribute and state attribute of roads, into measurable feature data and mapping road entities into a virtual world by means of suitable digital models established based on digital twin, BIM and other techniques. At present, digital modeling of static elements such as road alignment, lane layout, signs and markings has witnessed some progress. However, digital modeling of dynamic elements such as various pavement diseases with obvious temporal and spatial evolution properties appearing with the deterioration of roads after the roads are open to traffic is rarely reported.

Ruts, as one of the main diseases of asphalt pavements, receive extensive attention in the art. Previously, ruts are generally detected by manual inspection, and it is difficult to acquire cross-sectional shape data of the ruts in batches. In recent years, with the rapid development of automatic detection techniques and equipment, continuous and high-precision acquisition of cross-sectional data of ruts is realized gradually, including the name of road sections, spatial attributes of ruts, temporal attributes of ruts, predicted development, maintenance measures, and the like. However, these data cannot be directly used for digital modeling of ruts for the following reasons:

1. Redundant information and invalid information in mass detection data occupy a large storage space, and it is necessary to extract key attributes that can abstractly describe ruts to reserve main cross-sectional features of the ruts to improve modeling efficiency.

2. In physical entities, ruts are manifested as strip-shaped grooves in the longitudinal direction of roads, and in addition to depth and width features, the ruts also have a certain longitudinal length, so it is necessary to fuse multiple sets of cross-sectional data to construct a three-dimensional rut digital model.

In this context, some scholars and technicians have considered the parametric modeling of ruts, which is often excessively simplified and neglects the geometric fluctuation features of the cross-section of ruts.

BRIEF SUMMARY OF THE INVENTION

In view of the above-mentioned defects in the prior art, the technical issue to be settled by the invention is to provide an automatic generation method for three-dimensional morphology of ruts in asphalt pavements, which can select feature points according to geometric fluctuation features of rut cross-sections, connect the feature points and fit a cross-sectional curve according to the evolution law of rut deformation, and fuse multiple reconstructed rut cross-sections to realize automatic generation and visualization of three-dimensional morphology of ruts.

The technical solution adopted by the invention to settle the above technical issue is as follows: An automatic generation method for three-dimensional morphology of ruts in asphalt pavements comprises the following steps:

Step 1, constructing a standard rut cross-section representation model: based on a pavement reference line, sequentially arranging seven feature points A, B, C, D, E, F and G from left to right and sequentially connecting the seven feature points by a curve to form a W-shaped standard rut cross-section representation model with two sides being raised, wherein the feature points A and G both intersect with the pavement reference line and are referred to as a left edge point and a right edge point respectively; the feature points B and F are both located above the pavement reference line and are referred to as a left raised point and a right raised point respectively; the feature points C, D and E are all located below the pavement reference line, the feature point D is raised upwards, and the feature points C, D and E are referred to as a bottom left valley point, a bottom raised point and a bottom right valley point respectively; a plurality of enclosed sections are defined by the standard rut cross-section representation model and the pavement reference line; the enclosed section located above the pavement reference line is referred to as a positive section, and the enclosed section located below the pavement reference line is referred to as a negative section;

Step 2, classifying ruts: according to curve shapes of existing rut cross-sections, classifying ruts into nine types: U-shaped ruts without raised edges, U-shaped ruts with one raised edge, U-shaped ruts with two raised edges, W-I-shaped ruts without raised edges, W-I-shaped ruts with one raised edge, W-I-shaped ruts with two raised edges, W-II-shaped ruts without raised edges, W-II-shaped ruts with one raised edge and W-II-shaped ruts with two raised edges, wherein the nine types of ruts are available through matching by adjusting spatial positions of the seven feature points in the standard rut cross-section representation model constructed in Step 1; the difference between W-I-shaped ruts and W-II-shaped ruts is that the bottom raised point D of the W-I-shaped ruts is located in the negative section while the bottom raised point D of the W-II-shaped ruts is located in the positive section;

Step 3, acquiring original rut cross-sections: for an asphalt pavement, three-dimensional morphology of a rut in which is to be generated, selecting a plurality of original rut cross-sections $t_i$ at equal intervals in a longitudinal direction of the pavement, wherein i≥3;

Step 4, performing preprocessing: denoising and smoothening each original rut cross-section $t_i$ selected in Step 3 to obtain a preprocessed rut cross-section $T_i$;

Step 5, classifying sections: obtaining intersection points between the rut cross-section $T_i$ and the pavement reference line, and classifying enclosed sections defined by the rut cross-section $T_i$ and the pavement reference line into a plurality of positive sections and a plurality of negative sections according to the intersection points;

Step 6, searching for feature points: matching the number of the positive sections, the number of the negative sections and the distribution of extreme points obtained in Step 5 with the types of ruts in Step 2 to determine the type of the rut corresponding to the rut cross-section $T_i$; then, searching for feature points of the rut cross-section $T_i$ in each positive section and each negative section according to the determined type of the rut;

Step 7, reconstructing a rut cross-section $\hat{T}_i$: connecting the feature points by a smooth curve to form the reconstructed rut cross-section $\hat{T}_i$; and Step 8, in a three-dimensional environment, sequentially connecting all the reconstructed rut cross-sections $\hat{T}_i$ in the longitudinal direction of the pavement to generate three-dimensional morphology of the rut.

In Step 3, a longitudinal distance between the adjacent original rut cross-sections is not greater than 0.5 m.

In Step 3, to reserve fluctuation features of the rut cross-sections, the number of sampling points is not less than 11 when each original rut cross-section $t_i$ is selected, and a distance between the sampling points is not greater than 0.2 m.

In Step 2, the bottom left valley point C and the bottom right valley point E of the three types of W-I-shaped ruts and the three types of W-II-shaped ruts are minimum points in negative sections on two sides of the bottom raised point D; the bottom raised point D of the three types of W-I-shaped ruts is located in the negative section, and a height difference between the bottom raised point D and the bottom left valley point C or the bottom right valley point E of the three types of W-I-shaped ruts is not less than 5 mm; and the bottom raised point D of the three types of W-II-shaped ruts is located on the positive section, and a height difference between the bottom raised point D and the bottom left valley point C or the bottom right valley point E of the three types of W-II-shaped ruts is not less than 5 mm.

In Step 6, the type of the rut corresponding to the rut cross-sections $T_i$ is determined based on a machine-learning intelligent matching algorithm.

In Step 6, the type of the rut corresponding to the rut cross-section $T_i$ is recognized artificially or through a computer specifically by:

A, in a case where the rut cross-section $T_i$ has only one negative section, if a maximum point $P_k$ exists in the negative section and height differences between the maximum point $P_k$ and minimum points $Q_l$ and $Q_r$ in partial negative sections on two sides are not less than 5 mm, determining the rut corresponding to the rut cross-section $T_i$ as a W-I-shaped rut; otherwise, determining the rut corresponding to the rut cross-section $T_i$ as a U-shaped rut; then, performing further determination according to the number of positive sections specifically by:

A-1, in a case where the rut corresponding to the rut cross-section $T_i$ is determined as a W-I-shaped rut and the rut cross-section $T_i$ has no positive section, determining the rut corresponding to the rut cross-section $T_i$ as a W-I-shaped rut without raised edges;

A-2, in a case where the rut corresponding to the rut cross-section $T_i$ is determined as a U-shaped rut and the rut cross-section $T_i$ has no positive section, determining the rut corresponding to the rut cross-section $T_i$ as a U-shaped rut without raised edges;

A-3, in a case where the rut corresponding to the rut cross-section $T_i$ is determined as a W-I-shaped rut and the rut cross-section $T_i$ has one positive section, determining the rut corresponding to the rut cross-section $T_i$ as a W-I-shaped rut with one raised edge;

A-4, in a case where the rut corresponding to the rut cross-section $T_i$ is determined as a U-shaped rut and the rut cross-section $T_i$ has one positive section, determining the rut corresponding to the rut cross-section $T_i$ as a U-shaped rut with one raised edge;

A-5, in a case where the rut corresponding to the rut cross-section $T_i$ is determined as a W-I-shaped rut and the rut cross-section $T_i$ has two positive sections, determining the rut corresponding to the rut cross-section $T_i$ as a W-I-shaped rut with two raised edges; and A-6, in a case where the rut corresponding to the rut cross-section $T_i$ is determined as a U-shaped rut and the rut cross-section $T_i$ has two positive sections, determining the rut corresponding to the rut cross-section $T_i$ as a U-shaped rut with two raised edges; and B, in a case where the rut cross-section $T_i$ has two negative sections, determining the rut corresponding to the rut cross-section $T_i$ as a W-II-shaped rut, and performing further determination according to the number of positive sections as follows:

B-1, in a case where the rut cross-section $T_i$ has one positive section, determining the rut corresponding to the rut cross-section $T_i$ as a W-II-shaped rut without raised edges;

B-2, in a case where the rut cross-section $T_i$ has two positive sections, determining the rut corresponding to the rut cross-section $T_i$ as a W-II-shaped rut with one raised edge; and B-3, in a case where the rut cross-section $T_i$ has three positive sections, determining the rut corresponding to the rut cross-section $T_i$ as a W-II-shaped rut with two raised edges;

In Step 7, the features points are smoothly connected by the curve based on a trigonometric function or a growth curve function to form the reconstructed rut cross-section $\hat{T}_i$.

In Step 7, the features points are smoothly connected by the curve based on the trigonometric function or the growth curve function through the following steps:

Step 7-1, determining horizontal positions of segmenting points: selecting adjacent feature points $F_{k-1}(X_{k-1}, Y_{k-1})$ and $F_k(X_k, Y_k)$ as initial and end points of a segmenting curve, then dividing a horizontal distance between the two selected feature points at equal intervals to form n segmenting points, and determining a horizontal position coordinate $X_i$ of an $i^{th}$ segmenting point, wherein $1 \leq i \leq n$;

Step 7-2, determining vertical positions of the segmenting points: calculating a vertical position coordinate of the $i^{th}$ segmenting point according to the following trigonometric function:

$$Y_i = \frac{Y_k - Y_{k-1}}{2} \times \sin\left(\frac{\pi}{X_k - X_{k-1}} \times \left(X_i - \frac{X_k + X_{k-1}}{2}\right)\right) - \frac{Y_k + Y_{k-1}}{2} \quad (1)$$

Step 7-3, performing curve smoothing: obtaining coordinate positions of the segmenting points according to the horizontal positions of the segmenting points determined in Step 7-1 and the vertical positions of the segmenting points determined in Step 7-2, and sequentially connecting the feature points and the segmenting points from left to right to form the rut cross-section $\hat{T}_i$.

In Step 7-1, the number of the segmenting points between the two adjacent feature points is determined according to the horizontal distance between the two feature points.

The invention specifically has the following beneficial effects: (1) feature points are selected according to geometric fluctuation features of the rut cross-sections, thus reserving key geometric features of the rut cross-sections, improving modeling efficiency and reducing storage space; (2) the spatial positions of feature points can be adjusted to flexibly match and realize complex rut cross-sections in engineering, so the method provided by invention has universality; (3) the feature points are connected and a cross-sectional curve is fit based on the decay law of pavement materials and the evolution law of rut deformation, so a rut cross-section representation model can be constructed quickly to provide a theoretical basis for digital modeling of ruts.

DETAILED DESCRIPTION OF THE INVENTION

The invention will be described in further detail below in conjunction with accompanying drawings and specific preferred embodiments.

In the description of the invention, it should be understood that terms such as "left", "right", "upper" and "lower" are used for indicating directional or positional relationships based on the accompanying drawings merely for the purpose of facilitating and simplifying the description of the invention and do not imply or indicate that devices or elements referred to must be in a specific direction or be configured and operated in a specific direction, and terms such as "first" and "second" do not indicate the degree of importance of parts and thus should not be construed as limitations of the invention. Specific dimensions adopted in this embodiment are merely for describing the technical solution by way of examples and are not intended to limit the protection scope of the invention.

Figure 1:
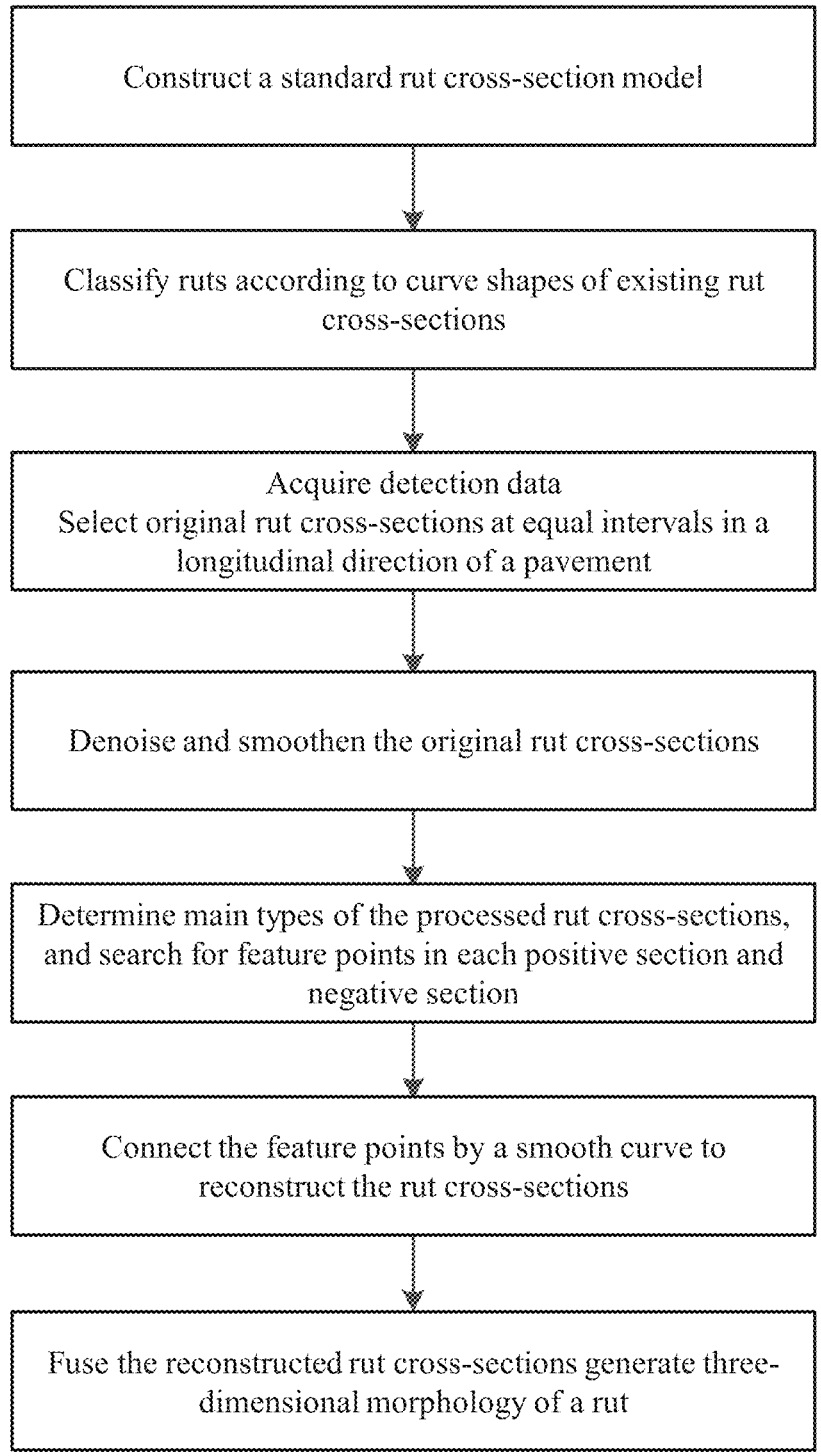
FIG. 1 is a flow diagram of an automatic generation method for three-dimensional morphology of ruts in asphalt pavements.

As shown in FIG. 1, an automatic generation method for three-dimensional morphology of ruts in asphalt pavements comprises the following steps:

Step 1, constructing a standard rut cross-section representation model.

In the invention, a pavement reference line is determined preferably by connecting two endpoints of two sides of the cross-section of a lane in the road design document.

Figure 3:
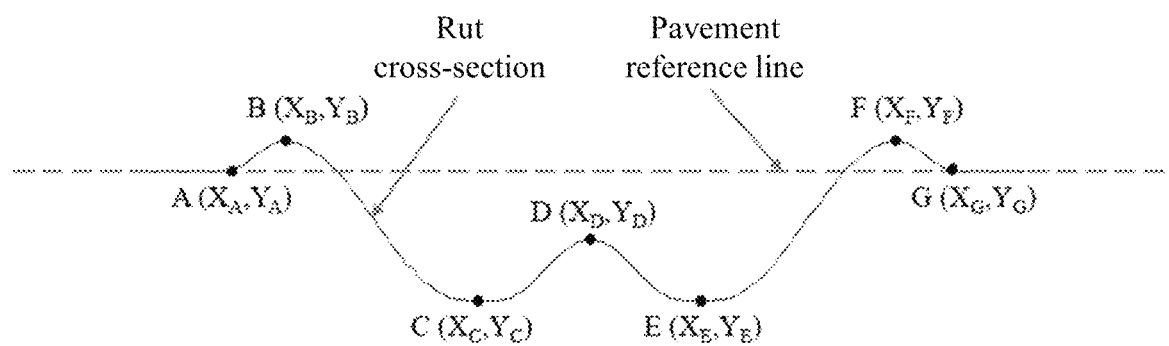
FIG. 3 is a schematic diagram of a standard rut cross-section representation model.

As shown in FIG. 3, based on the pavement reference line, seven feature points A, B, C, D, E, F and G are sequentially arranged from left to right and sequentially connected by a curve to form a W-shaped standard rut cross-section representation model with two sides being raised, wherein the feature points A ($X_A$, $Y_A$) and G ($X_G$, $Y_G$) both intersect with the pavement reference line and are referred to as a left edge point and a right edge point respectively; the feature points B ($X_B$, $Y_B$) and F ($X_F$, $Y_F$) are both located above the pavement reference line and are referred to as a left raised point and a right raised point respectively; the feature points C ($X_C$, $Y_C$), D ($X_D$, $Y_D$) and E ($X_E$, $Y_E$) are all located below the pavement reference line, the feature point D is raised upwards, and the feature points C, D and E are referred to as a bottom left valley point, a bottom raised point and a bottom right valley point respectively; a plurality of enclosed sections are defined by the standard rut cross-section representation model and the pavement reference line; the enclosed section located above the pavement reference line (a partial rut cross-section between adjacent feature points above the pavement reference line) is referred to as a positive section, and the enclosed section located below the pavement reference line (a partial rut cross-section between adjacent feature points below the pavement reference line) is referred to as a negative section.

Step 2, classifying ruts.

According to curve shapes of existing rut cross-sections, ruts are roughly classified into three types and finely classified into nine types.

Figure 2:
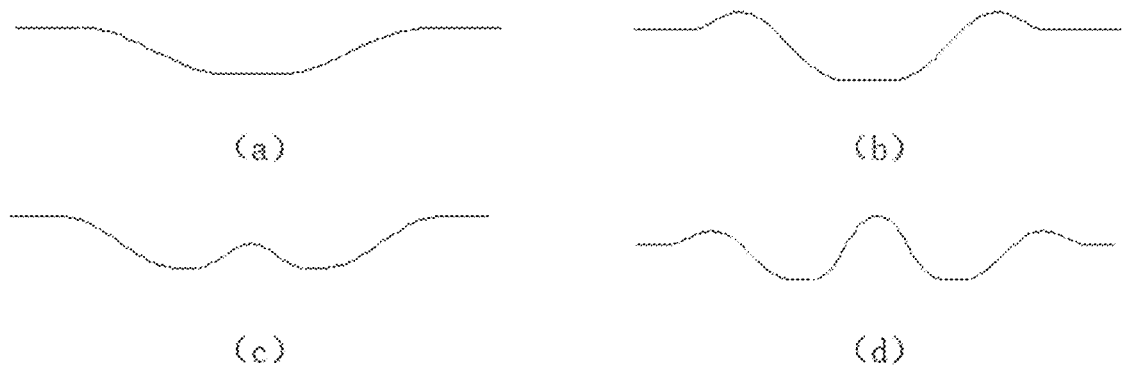
FIG. 2 is a schematic diagram of main types of rut cross-sections, wherein (a) illustrates the cross-section of a U-shaped rut without raised edges; (b) illustrates the cross-section of a U-shaped rut with two raised edges; (c) illustrates the cross-section of a W-I-shaped rut without raised edges; (d) illustrates the cross-section of a W-II-shaped rut with two raised edges.

As shown in FIG. 2, the three types of ruts are U-shaped ruts, W-I-shaped ruts and W-II-shaped ruts respectively.

The U-shaped ruts comprise U-shaped ruts without raised edges, U-shaped ruts with one raised edge and U-shaped ruts with two raised edges.

The W-I-shaped ruts comprise W-I-shaped ruts without raised edges, W-I-shaped ruts with one raised edge and W-I-shaped ruts with two raised edges.

The W-II-shaped ruts comprise W-II-shaped ruts without raised edges, W-II-shaped ruts with one raised edge and W-II-shaped ruts with two raised edges.

The difference between the W-I-shaped ruts and the W-II-shaped ruts is that the bottom raised point D of the W-I-shaped ruts is located in the negative section while the bottom raised point D of the W-II-shaped ruts is located in the positive section.

The bottom left valley point C and the bottom right valley point E of the three types of W-I-shaped ruts and the three types of W-II-shaped ruts are minimum points in negative sections on two sides of the bottom raised point D. The bottom raised point D of the three types of W-I-shaped ruts is located in the negative section, and a height difference between the bottom raised point D and the bottom left valley point C or the bottom right valley point E of the three types of W-I-shaped ruts is not less than 5 mm.

The bottom raised point D of the three types of W-II-shaped ruts is located on the positive section, and a height difference between the bottom raised point D and the bottom left valley point C or the bottom right valley point E of the three types of W-II-shaped ruts is not less than 5 mm.

The nine types of ruts can be obtained through matching by adjusting spatial positions of the seven feature points in the standard rut cross-section representation model constructed in Step 1

Step 3, acquiring original rut cross-sections.

For an asphalt pavement, three-dimensional morphology of a rut in which is to be generated, a plurality of original rut cross-sections $t_i$ are selected at equal intervals in a longitudinal direction of the pavement, wherein i≥3;

To reserve fluctuation features of the rut cross-sections, the number of sampling points is not less than 11 when each original rut cross-section $t_i$ is selected, and a distance between the sampling points is not greater than 0.2 m. A longitudinal distance between the adjacent original rut cross-sections is not greater than 0.5 m.

Figure 4:
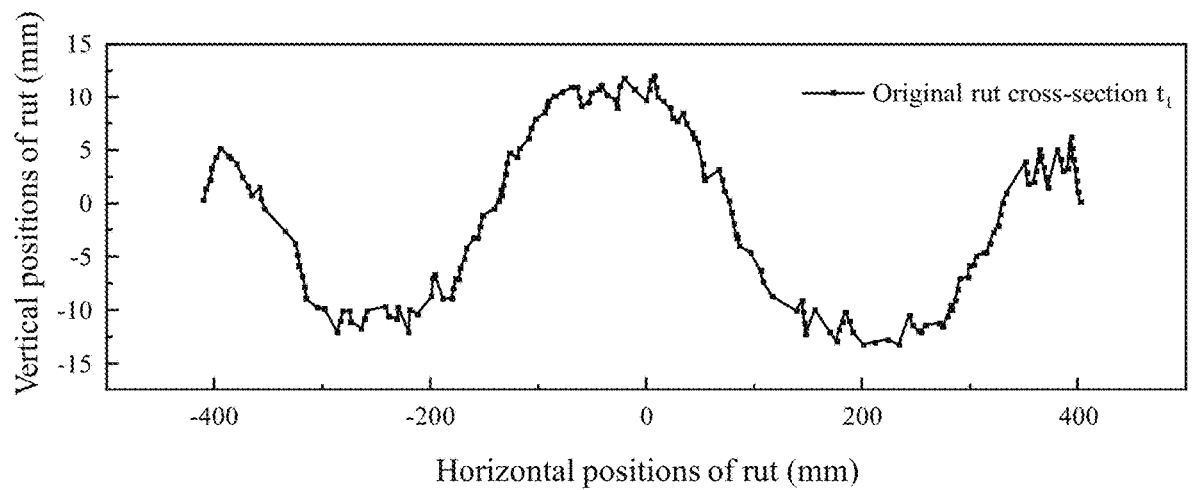
FIG. 4 is a schematic diagram of an original rut cross-section of a tested section.

In this embodiment, the rut cross-sections are selected and marked preferably at an interval of 0.1 m in the longitudinal direction of the pavement, and the original rut cross-section $t_1$ is shown in FIG. 4.

Step 4, performing preprocessing: denoising and smoothening each original rut cross-section $t_i$ selected in Step 3 to obtain a preprocessed rut cross-section $T_i$.

Figure 5:
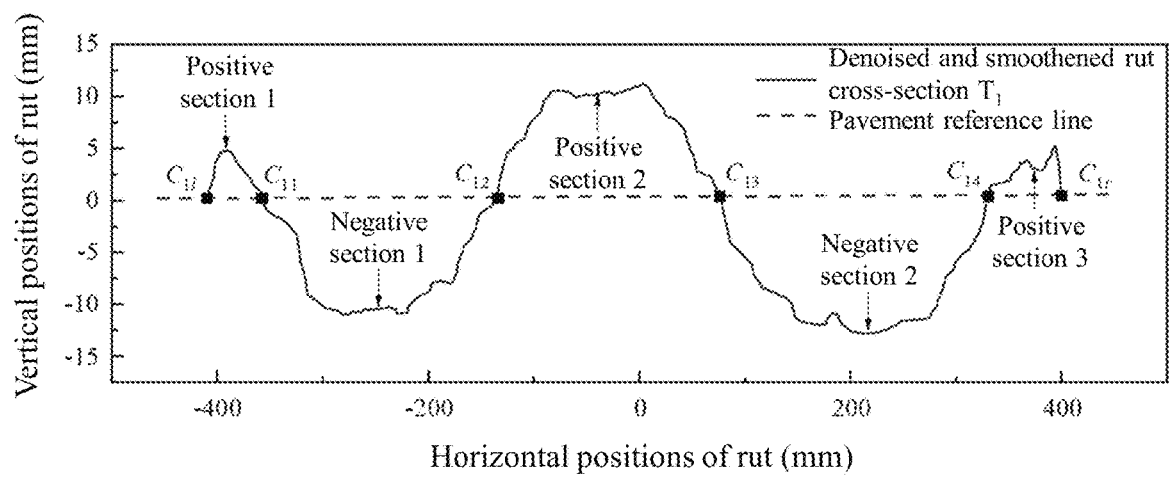
FIG. 5 is a schematic diagram of a denoised and smoothened rut cross-section of the tested section.

In this embodiment, a Savitzky-Golay filter fitting method is preferably used for denoising and smoothening, and the processed rut cross-section $T_1$ are shown in FIG. 5.

Step 5, classifying sections: obtaining intersection points between the rut cross-section $T_i$ and the pavement reference line, and classifying enclosed sections defined by the rut cross-section $T_i$ and the pavement reference line into a plurality of positive sections and a plurality of negative sections according to the intersection points.

In this embodiment, the pavement datum line and the rut cross-section $T_1$ have five interaction points, marked as an array ($C_{1l}$, $C_{11}$, $C_{12}$, $C_{13}$, $C_{14}$, $C_{1r}$). A positive section 1, a positive section 2 and a positive section 3 are located above a connecting line $C_1C_{11}$, a connecting line $C_{12}C_{13}$ and a connecting line $C_{14}C_{1r}$ respectively, and a negative section 1 and a negative section 2 are located below a connecting line $C_{11}C_{12}$ and a connecting line $C_{13}C_{14}$, as shown in FIG. 5.

Step 6, searching for feature points: matching the number of the positive sections, the number of the negative sections and the distribution of extreme points obtained in Step 5 with the types of ruts in Step 2 to determine the type of the rut corresponding to the rut cross-section $T_i$; then, searching for feature points of the rut cross-section $T_i$ in each positive section and each negative section according to the determined type of the rut.

After section division, data analysis is performed on each section to search for all maximum points in the section $D_j$, the maximum points are marked as a maximum point array ($P_{ij1}$, $P_{ij2}$, $P_{ij3}$, ..., $P_{ijn}$) and all minimum points are marked as a minimum point array ($Q_{ij1}$, $Q_{ij2}$, $Q_{ij3}$, ..., $Q_{ijm}$).

The type of the rut corresponding to the rut cross-sections $T_i$ may be recognized artificially or by a computer or determined based on a machine-learning intelligent matching algorithm. Wherein, the type of the rut corresponding to the rut cross-sections $T_i$ is recognized artificially or through a computer specifically and preferably by:

A, in a case where the rut cross-section $T_i$ has only one negative section, if a maximum point $P_k$ exists in the negative section and height differences between the maximum point $P_k$ and minimum points $Q_l$ and $Q_r$ in partial negative sections on two sides are not less than 5 mm, determining the rut corresponding to the rut cross-section $T_i$ as a W-I-shaped rut; otherwise, determining the rut corresponding to the rut cross-section $T_i$ as a U-shaped rut; then, performing further determination according to the number of positive sections specifically by:

A-1, in a case where the rut corresponding to the rut cross-section $T_i$ is determined as a W-I-shaped rut and the rut cross-section $T_i$ has no positive section, determining the rut corresponding to the rut cross-section $T_i$ as a W-I-shaped rut without raised edges;

A-2, in a case where the rut corresponding to the rut cross-section $T_i$ is determined as a U-shaped rut and the rut cross-section $T_i$ has no positive section, determining the rut corresponding to the rut cross-section $T_i$ as a U-shaped rut without raised edges;

A-3, in a case where the rut corresponding to the rut cross-section $T_i$ is determined as a W-I-shaped rut and the rut cross-section $T_i$ has one positive section, determining the rut corresponding to the rut cross-section $T_i$ as a W-I-shaped rut with one raised edge;

A-4, in a case where the rut corresponding to the rut cross-section $T_i$ is determined as a U-shaped rut and the rut cross-section $T_i$ has one positive section, determining the rut corresponding to the rut cross-section $T_i$ as a U-shaped rut with one raised edge;

A-5, in a case where the rut corresponding to the rut cross-section $T_i$ is determined as a W-I-shaped rut and the rut cross-section $T_i$ has two positive sections, determining the rut corresponding to the rut cross-section $T_i$ as a W-I-shaped rut with two raised edges; and A-6, in a case where the rut corresponding to the rut cross-section $T_i$ is determined as a U-shaped rut and the rut cross-section $T_i$ has two positive sections, determining the rut corresponding to the rut cross-section $T_i$ as a U-shaped rut with two raised edges; and B, in a case where the rut cross-section $T_i$ has two negative sections, determining the rut corresponding to the rut cross-section $T_i$ as a W-II-shaped rut, and performing further determination according to the number of positive sections as follows:

B-1, in a case where the rut cross-section $T_i$ has one positive section, determining the rut corresponding to the rut cross-section $T_i$ as a W-II-shaped rut without raised edges;

B-2, in a case where the rut cross-section $T_i$ has two positive sections, determining the rut corresponding to the rut cross-section $T_i$ as a W-II-shaped rut with one raised edge; and B-3, in a case where the rut cross-section $T_i$ has three positive sections, determining the rut corresponding to the rut cross-section $T_i$ as a W-II-shaped rut with two raised edges.

Finally, the feature points of the rut cross-section $T_i$ are searched for in each positive section and each negative section according to the determined type of the rut.

Wherein, the left edge point and the right edge point are defined as an intersection point between the pavement reference line and the left side of the rut cross section $T_i$ and an intersection point between the pavement reference line and the right side of the rut cross section $T_i$. The left raised point and the right raised point are defined as maximum points on positive sections on left and right sides. For the W-I-shaped ruts, the bottom raised point is defined as a point having a maximum difference (not less than 5 mm) with minimum points in negative sections on two sides of the bottom raised point. For the W-II-shaped ruts, the bottom raised point is defined as a maximum point in the middle positive section. For the W-shaped ruts, the bottom left valley point and the bottom right valley point are defined as minimum points in the negative sections on two sides of the bottom raised point. For the U-shaped ruts, the bottom left valley point and the bottom right valley point coincide and are defined as minimum points in negative sections.

Figure 6:
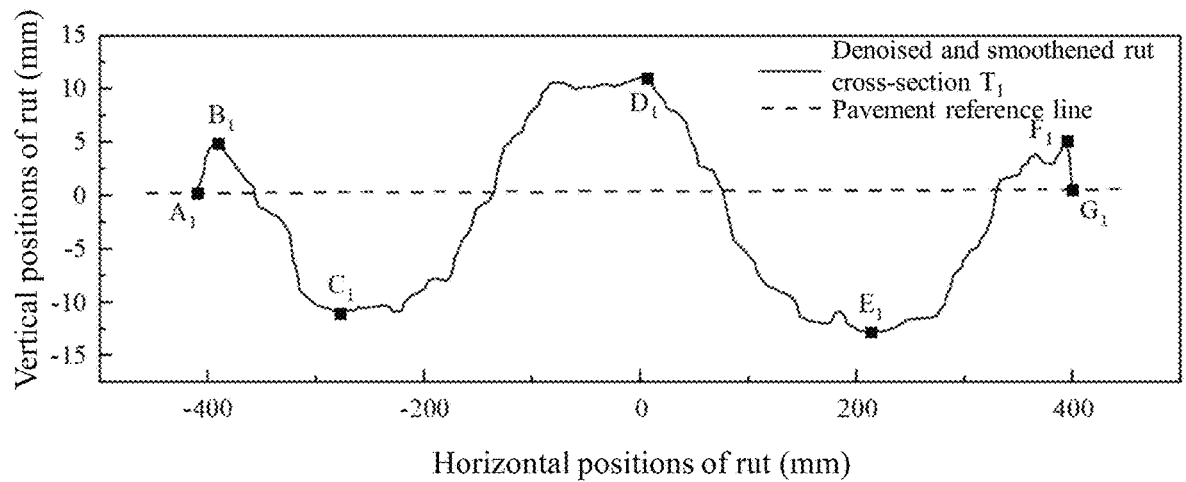
FIG. 6 is a schematic diagram of feature points of the rut cross-section.

In this embodiment, it can be known, by artificial recognition, that $T_1$ has two negative sections and three positive sections, so the rut corresponding to $T_1$ is a W-II-shaped rut with two raised edges. By searching for feature points section-by-section, a left edge point $A_1$ (−407.53, 0.13), a left raised point $B_1$ (−393.58, 4.67), a bottom left valley point $C_1$ (−274.43, −10.99), a bottom raised point $D_i$(7.46, 11.16), a bottom right valley point $E_1$ (211.70, −12.82), a right raised point $F_1$ (394.67, 4.58) and a right edge point $G_1$ (399.98, 0.28) are obtained. As shown in FIG. 6, wherein, the zero point in the horizontal direction is the midpoint of the rut cross-section.

Step 7, smoothly connecting the features points by a curve based on a trigonometric function or a growth curve function to form a reconstructed rut cross-section $\hat{T}_i$. Wherein, the features points are smoothly connected by the curve preferably through the following steps:

Step 7.1, determining horizontal positions of segmenting points: selecting adjacent feature points $F_{k-1}(X_{k-1}, Y_{k-1})$ and $F_k (X_k, Y_k)$ as initial and end points of a segmenting curve, then dividing a horizontal distance between the two selected feature points at equal intervals to form n segmenting points, and determining a horizontal position coordinate $X_i$ of an $i^{th}$ segmenting point, wherein $1 \leq i \leq n$;

Step 7-2, determining vertical positions of the segmenting points: calculating a vertical position coordinate of the $i^{th}$ segmenting point according to the following trigonometric function:

$$Y_i = \frac{Y_k - Y_{k-1}}{2} \times \sin\left(\frac{\pi}{X_k - X_{k-1}} \times \left(X_i - \frac{X_k + X_{k-1}}{2}\right)\right) - \frac{Y_k + Y_{k-1}}{2} \quad (1)$$

Step 7-3, performing curve smoothing: obtaining coordinate positions of the segmenting points according to the horizontal positions of the segmenting points determined in Step 7-1 and the vertical positions of the segmenting points determined in Step 7-2, and sequentially connecting the feature points and the segmenting points from left to right to form the rut cross-section $\hat{T}_i$.

In Step 7-1, the number of the segmenting points between the two adjacent feature points is determined according to the horizontal distance between the two feature points.

Figure 7:
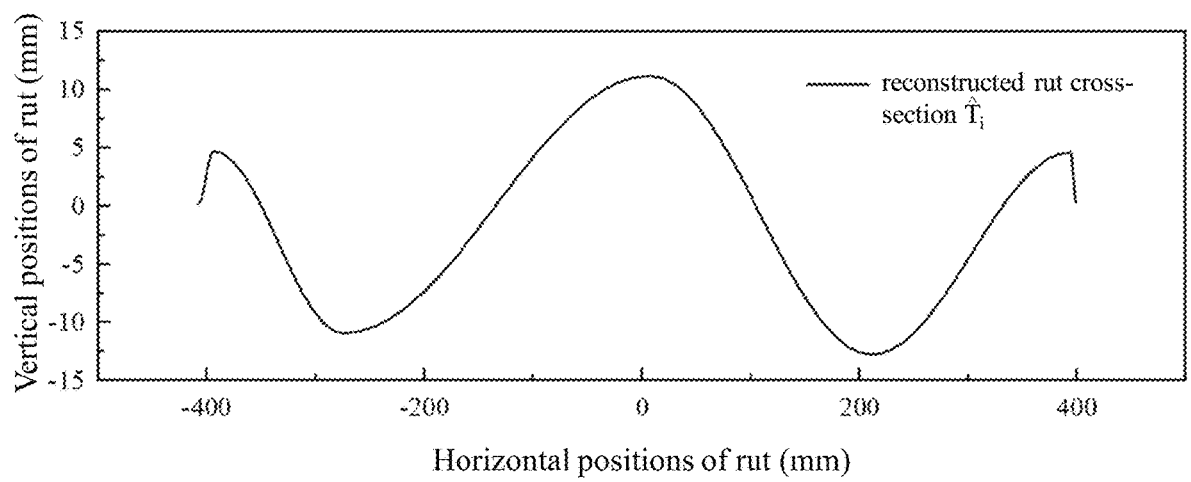
FIG. 7 is a schematic diagram of a rut cross-section fitted by means of a trigonometric function.

In this embodiment, based on the feature points of the rut cross-section $T_1$ extracted in Step 6, with adjacent feature points as initial and end points, ten segmenting points are arranged for each section, fitting is performed from left to right, vertical positions of the segmenting points are calculated by formulas (2)-(7), and a reconstructed rut cross-section $\hat{T}_1$ is shown in FIG. 7.

$A_1B_1$ Section:

$$Y_i = \frac{4.67 - 0.13}{2} \times \sin\left(\frac{\pi}{-393.58 - (-407.53)} \times \left(X_i - \frac{-393.58 + (-407.53)}{2}\right)\right) - \frac{4.67 + 0.13}{2} \quad (2)$$

$C_1D_1$ Section:

$$Y_i = \frac{-10.99 - 4.67}{2} \times \sin\left(\frac{\pi}{-2.74.43 - (-393.58)} \times \left(X_i - \frac{-2.74.43 + (-393.58)}{2}\right)\right) - \frac{-10.99 + 4.67}{2} \quad (3)$$

$$Y_i = \frac{11.16 - (-12.82)}{2} \times \sin\left(\frac{\pi}{7.46 - (-274.43)} \times \left(X_i - \frac{7.46 + (-274.43)}{2}\right)\right) - \frac{11.16 + (-12.82)}{2} \quad (4)$$

$D_1E_1$ Section:

$$Y_i = \frac{-12.82 - 11.16}{2} \times \sin\left(\frac{\pi}{211.70 - (7.46)} \times \left(X_i - \frac{211.70 + (7.46)}{2}\right)\right) - \frac{-12.82 + 11.16}{2} \quad (5)$$

$E_1G_1$ Section:

$$Y_i = \frac{4.58 - (-12.82)}{2} \times \sin\left(\frac{\pi}{394.67 - 211.70} \times \left(X_i - \frac{394.67 + 211.70}{2}\right)\right) - \frac{4.58 + (-12.82)}{2} \quad (6)$$

$G_1F_1$ Section:

$$Y_i = \frac{0.28 - 4.58}{2} \times \sin\left(\frac{\pi}{399.98 - 394.67} \times \left(X_i - \frac{399.98 + 394.67}{2}\right)\right) - \frac{0.28 + 4.58}{2} \quad (7)$$

Step 8, in a three-dimensional environment, sequentially connecting all the reconstructed rut cross-sections $\hat{T}_i$ in the longitudinal direction of the pavement to generate three-dimensional morphology of the rut.

Figure 8:
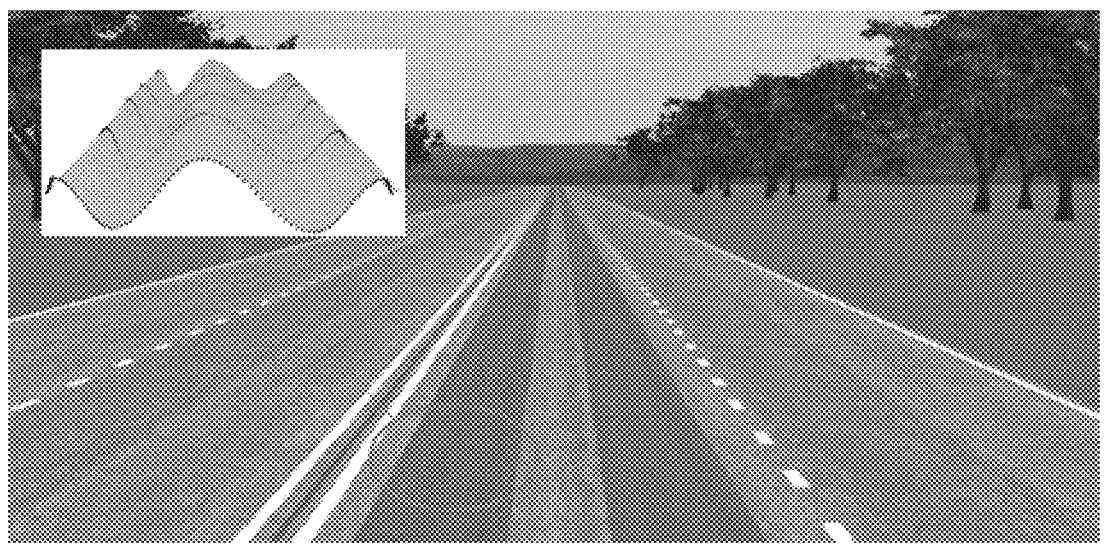
FIG. 8 is a schematic diagram of generated three-dimensional morphology of a rut in the tested section.

In this embodiment, after the rut cross-section $\hat{T}_1$ is reconstructed, Step 1-Step 5 are repeated to reconstruct marked rut cross-sections $\hat{T}_2, \hat{T}_3, \ldots, \hat{T}_{51}$, with a cumulative length of 5 m; and then, the all the reconstructed rut cross-sections are sequentially connected in the driving direction to generate the three-dimensional morphology of the rut, as shown in FIG. 8.

The invention can reserve key geometric features of rut cross-sections, thus solving the problems of low modeling efficiency and large storage space of existing digital modeling of ruts, having a wide application range, and being able to flexibly match and realize complex rut cross-sections in engineering. In addition, the invention can construct a rut cross-section representation model, thus providing a theoretical basis for digital modeling of ruts.

Preferred embodiments of the invention are described in detail above. However, the invention is not limited to the specific details in the above embodiments, various equivalent transformations can be made to the technical solution of the invention based on the technical concept of the invention, and all these equivalent transformations should fall within the protection scope of the invention.

What is claimed is:

1. An automatic generation method for three-dimensional morphology of ruts in asphalt pavements, comprising:

Step 1, constructing a standard rut cross-section representation model: based on a pavement reference line, sequentially arranging seven feature points A, B, C, D, E, F and G from left to right and sequentially connecting the seven feature points by a curve to form a W-shaped standard rut cross-section representation model with two sides being raised, wherein the feature points A and G both intersect with the pavement reference line and are referred to as a left edge point and a right edge point respectively; the feature points B and F are both located above the pavement reference line and are referred to as a left raised point and a right raised point respectively; the feature points C, D and E are all located below the pavement reference line, the feature point D is raised upwards, and the feature points C, D and E are referred to as a bottom left valley point, a bottom raised point and a bottom right valley point respectively; a plurality of enclosed sections are defined by the standard rut cross-section representation model and the pavement reference line; the enclosed section located above the pavement reference line is referred to as a positive section, and the enclosed section located below the pavement reference line is referred to as a negative section;

Step 2: classifying ruts: according to curve shapes of existing rut cross-sections, classifying ruts into nine types: U-shaped ruts without raised edges, U-shaped ruts with one raised edge, U-shaped ruts with two raised edges, W-I-shaped ruts without raised edges, W-I-shaped ruts with one raised edge, W-I-shaped ruts with two raised edges, W-II-shaped ruts without raised edges, W-II-shaped ruts with one raised edge and W-II-shaped ruts with two raised edges, wherein the nine types of ruts are available through matching by adjusting spatial positions of the seven feature points in the standard rut cross-section representation model constructed in the Step 1; the difference between the W-I-shaped ruts and the W-II-shaped ruts is that the bottom raised point D of the W-I-shaped ruts is located in the negative section while the bottom raised point D of the W-II-shaped ruts is located in the positive section;

Step 3, acquiring original rut cross-sections: for an asphalt pavement, three-dimensional morphology of a rut in which is to be generated, selecting a plurality of original rut cross-sections $t_i$ at equal intervals in a longitudinal direction of the pavement, wherein i≥3;

Step 4, performing preprocessing: denoising and smoothening each of the original rut cross-sections $t_i$ selected in the Step 3 to obtain a rut cross-section $T_i$ that is preprocessed;

Step 5, classifying sections: obtaining intersection points between the rut cross-section $T_i$ and the pavement reference line, and classifying enclosed sections defined by the rut cross-section $T_i$ and the pavement reference line into a plurality of positive sections and a plurality of negative sections according to the intersection points;

Step 6, searching for feature points: matching the number of the positive sections, the number of the negative sections and the distribution of extreme points obtained in the Step 5 with the types of ruts in the Step 2 to determine the type of the rut corresponding to the rut cross-section $T_i$; then, searching for the feature points of the rut cross-section $T_i$ in each of the positive sections and each of the negative sections according to the determined type of the rut;

Step 7, reconstructing a rut cross-section $\hat{T}_i$: connecting the feature points by a smooth curve to form the reconstructed rut cross-section $\hat{T}_i$; and Step 8, in a three-dimensional environment, sequentially connecting all the reconstructed rut cross-sections $\hat{T}_i$ in the longitudinal direction of the pavement to generate three-dimensional morphology of the rut.

2. The automatic generation method for three-dimensional morphology of ruts in asphalt pavements according to claim 1, wherein in the Step 3, a longitudinal distance between the adjacent of the original rut cross-sections is not greater than 0.5 m.

3. The automatic generation method for three-dimensional morphology of ruts in asphalt pavements according to claim 1, wherein in the Step 3, to reserve fluctuation features of the rut cross-sections, the number of sampling points is not less than 11 when each of the original rut cross-sections $t_i$ is selected, and a distance between the sampling points is not greater than 0.2 m.

4. The automatic generation method for three-dimensional morphology of ruts in asphalt pavements according to claim 1, wherein in the Step 2, the bottom left valley point C and the bottom right valley point E of the three types of the W-I-shaped ruts and the three types of the W-II-shaped ruts are minimum points in the negative sections on two sides of the bottom raised point D; the bottom raised point D of the three types of the W-I-shaped ruts is located in the negative section, and a height difference between the bottom raised point D and the bottom left valley point C or the bottom right valley point E of the three types of the W-I-shaped ruts is not less than 5 mm; and the bottom raised point D of the three types of the W-II-shaped ruts is located on the positive section, and a height difference between the bottom raised point D and the bottom left valley point C or the bottom right valley point E of the three types of the W-II-shaped ruts is not less than 5 mm.

5. The automatic generation method for three-dimensional morphology of ruts in asphalt pavements according to claim 4, wherein in the Step 6, the type of the rut corresponding to the rut cross-sections $T_i$ is determined based on a machine-learning intelligent matching algorithm.

6. The automatic generation method for three-dimensional morphology of ruts in asphalt pavements according to claim 4, wherein in the Step 6, the type of the rut corresponding to the rut cross-section $T_i$ is recognized artificially or through a computer specifically by:

A, in a case where the rut cross-section $T_i$ has only one negative section, if a maximum point $P_k$ exists in the negative section and height differences between the maximum point $P_k$ and minimum points $Q_l$ and $Q_r$ in partial negative sections on two sides are not less than 5 mm, determining the rut corresponding to the rut cross-section $T_i$ as a W-I-shaped rut; otherwise, determining the rut corresponding to the rut cross-section $T_i$ as a U-shaped rut; then, performing further determination according to the number of positive sections specifically by:

A-1, in a case where the rut corresponding to the rut cross-section $T_i$ is determined as a W-I-shaped rut and the rut cross-section $T_i$ has no positive section, determining the rut corresponding to the rut cross-section $T_i$ as a W-I-shaped rut without raised edges;

A-2, in a case where the rut corresponding to the rut cross-section $T_i$ is determined as a U-shaped rut and the rut cross-section $T_i$ has no positive section, determining the rut corresponding to the rut cross-section $T_i$ as a U-shaped rut without raised edges;

A-3, in a case where the rut corresponding to the rut cross-section $T_i$ is determined as a W-I-shaped rut and the rut cross-section $T_i$ has one positive section, determining the rut corresponding to the rut cross-section $T_i$ as a W-I-shaped rut with one raised edge;

A-4, in a case where the rut corresponding to the rut cross-section $T_i$ is determined as a U-shaped rut and the rut cross-section $T_i$ has one positive section, determining the rut corresponding to the rut cross-section $T_i$ as a U-shaped rut with one raised edge;

A-5, in a case where the rut corresponding to the rut cross-section $T_i$ is determined as a W-I-shaped rut and the rut cross-section $T_i$ has two positive sections, determining the rut corresponding to the rut cross-section $T_i$ as a W-I-shaped rut with two raised edges; and A-6, in a case where the rut corresponding to the rut cross-section $T_i$ is determined as a U-shaped rut and the rut cross-section $T_i$ has two positive sections, determining the rut corresponding to the rut cross-section $T_i$ as a U-shaped rut with two raised edges; and B, in a case where the rut cross-section $T_i$ has two negative sections, determining the rut corresponding to the rut cross-section $T_i$ as a W-II-shaped rut, and performing further determination according to the number of positive sections as follows:

B-1, in a case where the rut cross-section $T_i$ has one positive section, determining the rut corresponding to the rut cross-section $T_i$ as a W-II-shaped rut without raised edges;

B-2, in a case where the rut cross-section $T_i$ has two positive sections, determining the rut corresponding to the rut cross-section $T_i$ as a W-II-shaped rut with one raised edge; and B-3, in a case where the rut cross-section $T_i$ has three positive sections, determining the rut corresponding to the rut cross-section $T_i$ as a W-II-shaped rut with two raised edges.

7. The automatic generation method for three-dimensional morphology of ruts in asphalt pavements according to claim 1, wherein in the Step 7, the features points are smoothly connected by the curve based on a trigonometric function or a growth curve function to form the reconstructed rut cross-section $\hat{T}_i$.

8. The automatic generation method for three-dimensional morphology of ruts in asphalt pavements according to claim 7, wherein in the Step 7, the features points are smoothly connected by the curve based on the trigonometric function or the growth curve function through the following steps:

Step 7-1, determining horizontal positions of segmenting points: selecting adjacent feature points $F_{k-1}(X_{k-1}, Y_{k-1})$ and $F_k(X_k, Y_k)$ as initial and end points of a segmenting curve, then dividing a horizontal distance between the two selected feature points at equal intervals to form n segmenting points, and determining a horizontal position coordinate $X_i$ of an $i^{th}$ segmenting point, wherein $1 \leq i \leq n$;

Step 7-2, determining vertical positions of the segmenting points: calculating a vertical position coordinate of the ith segmenting point according to a following trigonometric function:

$$Y_i = \frac{Y_k - Y_{k-1}}{2} \times \sin\left(\frac{\pi}{X_k - X_{k-1}} \times \left(X_i - \frac{X_k + X_{k-1}}{2}\right)\right) - \frac{Y_k + Y_{k-1}}{2} \qquad (1)$$

Step 7-3, performing curve smoothing: obtaining coordinate positions of the segmenting points according to the horizontal positions of the segmenting points determined in the Step 7-1 and the vertical positions of the segmenting points determined in the Step 7-2, and sequentially connecting the feature points and the segmenting points from left to right to form the rut cross-section $\hat{T}_i$.

9. The automatic generation method for three-dimensional morphology of ruts in asphalt pavements according to claim 8, wherein in the Step 7-1, the number of the segmenting points between the two adjacent feature points is determined according to the horizontal distance between the two feature points.

* * * * *